United States Patent
Iacovangelo et al.

(10) Patent No.: US 6,365,016 B1
(45) Date of Patent: Apr. 2, 2002

(54) METHOD AND APPARATUS FOR ARC PLASMA DEPOSITION WITH EVAPORATION OF REAGENTS

(75) Inventors: Charles Dominic Iacovangelo, Schenectady; Keith Milton Borst, Scotia; Elihu Calvin Jerabek, Glenmont; Patrick Peter Marzano; Barry Lee-Mean Yang, both of Clifton Park, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/271,655

(22) Filed: Mar. 17, 1999

(51) Int. Cl.$^7$ .................. C23C 14/08; C23C 14/30; C23C 14/32
(52) U.S. Cl. ............. 204/192.38; 427/567; 427/564; 427/453; 427/455; 427/580; 427/576
(58) Field of Search ................. 427/453, 455, 427/529, 530, 531, 564, 566, 567, 576, 580; 204/192.38

(56) References Cited

U.S. PATENT DOCUMENTS

| | | |
|---|---|---|
| 3,161,615 A | 12/1964 | Goldberg |
| 3,220,973 A | 11/1965 | Goldberg |
| 3,312,659 A | 4/1967 | Kurkjy et al. |
| 3,312,660 A | 4/1967 | Kurkjy et al. |
| 3,313,777 A | 4/1967 | Elam et al. |

(List continued on next page.)

FOREIGN PATENT DOCUMENTS

| | | |
|---|---|---|
| DE | 3014258 | 10/1981 |
| EP | 0293229 | 11/1988 |
| EP | 0617142 | 9/1994 |
| EP | 0887110 | 12/1998 |
| EP | 0887437 | 12/1998 |
| WO | 8901957 | 8/1988 |
| WO | 9213517 | 2/1992 |
| WO | 9713802 | 10/1996 |

OTHER PUBLICATIONS

N. Rao et al., *Nanoparticle Formation Using a Plasma Expansion Process*, 6052 Plasma Chemistry and Plasma Processing, Dec. 15, 1995, No. 4. pp. 581–606.

S. Anders et al., "Formation of Metal Oxides by Cathodic Arc Deposition," 76–77 *Surface and Coatings Technology*, pp. 167–173 (1995), no month.

H. Bolt et al., "Gradient Metal—a–C:H Coatings Deposited From Dense Plasma by a Combined PVD/CVD Process", 98 *Surface and Coatings Technology*, p. 1518–1523 (1998), no month.

D.E. Brodie et al., "Characterization of ZnO for the Fabrication of Conductor–Insulator–Semiconductor (CIS) Solar Cells", Conf. Proc. for IEEE 14th Photovoltaic Spec. Conf. 468–471 (Jan. 7–10, 1980).

(List continued on next page.)

*Primary Examiner*—Marianne Padgett
(74) *Attorney, Agent, or Firm*—Robert P. Santandrea; Noreen C. Johnson

(57) ABSTRACT

A method and apparatus for depositing a coating on a substrate. A method of coating a substrate comprises evaporating a first reactant; introducing the evaporated reactant into a plasma; and depositing the first reactant on a surface of the substrate. This method may be used to deposit an electrically conductive, ultraviolet filter coating at high rate on a glass or polycarbonate substrate, for example. An apparatus for depositing a UV filter coating on a polymeric substrate comprises a plasma generator having an anode and a cathode to form a plasma, and a first inlet for introducing a first reactant into the plasma, the first reactant comprising an evaporated material that is deposited on the substrate by the plasma. Optionally, a nozzle can be utilized to provide a controlled delivery of the first reactant into the plasma.

41 Claims, 8 Drawing Sheets

U.S. PATENT DOCUMENTS

| | | | |
|---|---|---|---|
| 3,576,656 A | | 4/1971 | Webb et al. |
| 3,625,848 A | | 12/1971 | Snaper ........................ 204/192 |
| 3,666,614 A | | 5/1972 | Snedeker et al. |
| 3,989,672 A | | 11/1976 | Vestergaard |
| 4,194,038 A | | 3/1980 | Baker et al. |
| 4,200,681 A | | 4/1980 | Hall et al. |
| 4,210,699 A | | 7/1980 | Schroeter et al. |
| 4,224,378 A | | 9/1980 | Schroeter et al. |
| 4,242,381 A | | 12/1980 | Goossens et al. |
| 4,352,834 A | * | 10/1982 | Taketoshi et al. ........... 427/580 |
| 4,454,275 A | | 6/1984 | Rosenquist |
| 4,746,537 A | * | 5/1988 | Takeuchi et al. ............ 427/580 |
| 4,842,941 A | | 6/1989 | Devins et al. |
| 4,871,580 A | | 10/1989 | Schram et al. |
| 4,877,505 A | * | 10/1989 | Bergman ............... 204/192.38 |
| 4,927,704 A | | 5/1990 | Reed et al. |
| 4,929,321 A | * | 5/1990 | Buhl .......................... 427/580 |
| 4,929,322 A | * | 5/1990 | Sue et al. ................... 427/580 |
| 4,948,485 A | | 8/1990 | Wallsten et al. |
| 4,990,361 A | * | 2/1991 | Vasunaga et al. ........... 427/580 |
| 5,008,148 A | | 4/1991 | Thurm et al. |
| 5,009,922 A | * | 4/1991 | Harano et al. ......... 204/192.38 |
| 5,051,308 A | | 9/1991 | Reed et al. |
| 5,096,558 A | * | 3/1992 | Ehrich ................... 204/192.38 |
| 5,126,030 A | * | 6/1992 | Tamagaki et al. ........... 427/580 |
| 5,152,866 A | * | 10/1992 | Ayman, Jr. et al. ..... 204/192.38 |
| 5,156,882 A | | 10/1992 | Rzad et al. |
| 5,298,587 A | | 3/1994 | Hu et al. |
| 5,302,271 A | * | 4/1994 | Chan et al. .................. 527/580 |
| 5,320,875 A | | 6/1994 | Hu et al. |
| 5,384,018 A | * | 1/1995 | Ramm et al. ............... 427/580 |
| 5,433,786 A | | 7/1995 | Hu et al. |
| 5,441,624 A | * | 8/1995 | Chan et al. .................. 427/580 |
| 5,463,013 A | | 10/1995 | Tokuda et al. |
| 5,480,722 A | | 1/1996 | Tomonaga et al. |
| 5,494,712 A | | 2/1996 | Hu et al. |
| 5,510,448 A | | 4/1996 | Fontane et al. |
| 5,571,332 A | | 11/1996 | Halpern ................ 118/723 HC |
| 5,614,248 A | | 3/1997 | Schiller et al. |
| 5,635,087 A | | 6/1997 | Schiller et al. |
| 5,691,010 A | * | 11/1997 | Kuramoto et al. .......... 427/580 |
| 5,718,967 A | | 2/1998 | Hu et al. |
| 5,827,580 A | * | 10/1998 | Anders et al. ............... 427/580 |
| 5,840,163 A | * | 11/1998 | Welty .......................... 427/580 |
| 5,952,061 A | * | 9/1999 | Yoshida et al. ......... 204/192.38 |
| 5,976,636 A | * | 11/1999 | Leu et al. ............... 204/192.38 |

OTHER PUBLICATIONS

D.A. Gerdeman and N.L. Hecht, *Arc Plasma Technology in Materials Science* excerpt pp.1–17 (1972) no month.

S. Jäger et al., "Comparison of Transparent Conductive Oxide Thin Films Prepared by A.C. and D.C. Reactive Magnetron Sputtering," 98 *Surface and Coatings Technology*, p. 1304–1314 (1998) no month.

Jianhua Hu and Roy G. Gordon, "Depostion of Boron Doped Zinc Oxide Films and Their Electrica and Optical Properties", vol. 139, No. 7 *J. Electrochem. Soc* p. 2014–2022 (Jul. 1992).

Z.–C. Jin et al., "Optical Properties of Sputter–Deposited ZnO:A1 Thin Film," 64(10) *J. Appl. Phys.* p. 5117–5131 (1988). Nov. 15, 1988).

R.A. MacGill et al., "Cathodic Arc Deposition of Copper Oxide Thin Films", 78 *Surface and Coatings Technology* 168–72 (1996) no month.

S. Major et al., "Electrical and Optical Transport in Undoped and Indium–doped Zinc Oxide Films," 1(2) *J. Mater. Res.* p. 300–310 (Mar./Apr. 1986).

S. Maniv et al., "Transparent Conducting Zinc Oxide and Indium–Tin Oxide Films Prepared by Modified Reactive Planar Magnetron Sputtering", A1(3), *J. Vac. Sci. Tech.*, p. 1370–1375 (Jul./Sep. 1983).

Tadatsugu Minami et al., "Group III Impurity Doped Zinc Oxide Thin Films Prepared by RF Magnetron Sputtering", vol. 24, No. 10, *Japenese J. of Appl. Phy.*, p. L781–L784, (Oct. 1985).

Tadatsugu Minmai et al., "Hightly Conductive and Transparent Silicon Doped Zinc Oxed Thin Films Prepared by RF Magnetron Sputtering", vol. 25, No. 9, *Japanese J. of Appl. Phys.* p. L776–L779, (Sep. 1986).

M. Miyazaki and E. Ando, "Durability Improvement of Ag–Based Low–Emissivity Coatings", 178, *J. Non–Crystalline Solids* p. 245–249 (1994) no month.

C.X. Qiu and I. Shih, "Tin– and Indium–Doped Zinc Oxide Films Prepared by RF Magnetreon Sputtering," 13 *Solar Energy Materials*, p. 75–84 (1986) No month.

S. Major et al., "Highly Transparent and Conducting Indium–Doped Zinc Oxide Films by Spray Pyrolysis", 108 *Thin Solid Films* p. 333–340 (1983) No month.

D. Raviendra and J.K. Sharma, "Electroless Deposition of Cadmium Stannate, Zinc Oxide, and Aluminum–Doped Zinc Oxide Films", 58 (2), *J. Appl. Phys.* p. 838–844 (Jul. 1985).

R.E.I. Schropp et al., "Transparent and Conductive Thin Films of ZnO for Photovoltaic Applications Prepared by RF Magnetron Sputtering", 1, Conf. Rec. of 20th IEEE Photovoltaic Spec. Conf. 273–276 (Sep. 26, 1988).

B.E. Sernelius et al., "Band–Gap Tailoring of ZnO By Means of Heavy A1 Doping", vol. 37, No. 17, *Physical Review B of Am. Phys. Soc.*, p. 10244–10248 Jun. 15, 1988.

I. Shih and C.X. Qiu, "Indium–Doped Zinc Oxide Thin Films Prepared by RF Magnetron Sputtering", 58(6), *J. Appl. Phys*, p.2400–2401 (Sep. 15, 1985).

S. Sreedhara Reddy et al., "Optical Properties of Spray Deposited ZnO Films", vol. 77, No. 12, *Solid State Communications*, p. 899–901 (1991) no month.

* cited by examiner

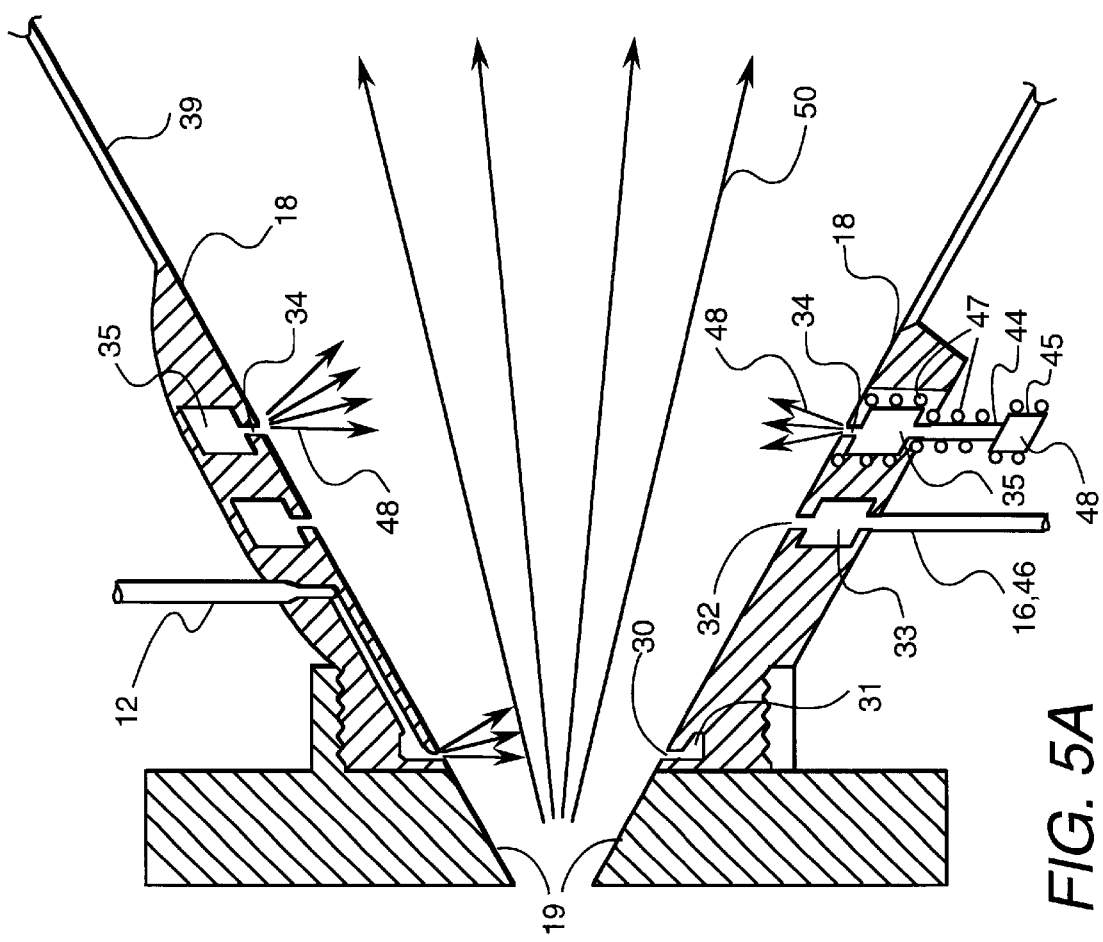
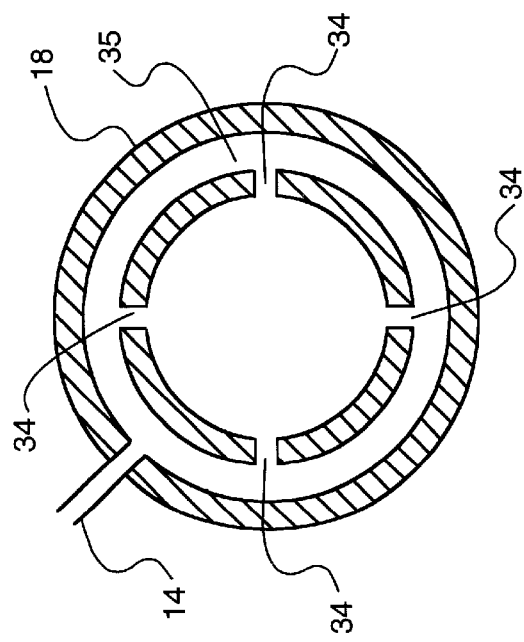
FIG. 5A
FIG. 4

METHOD AND APPARATUS FOR ARC PLASMA DEPOSITION WITH EVAPORATION OF REAGENTS

FIELD OF THE INVENTION

The present invention relates generally to a method and apparatus for deposition of reagents, and more particularly to an arc plasma deposition method and apparatus in which the reagents are evaporated into the plasma.

BACKGROUND

The use of a polycarbonate (PC) sheet or film for outdoor applications such as architectural glazing and automotive glazing typically requires the PC to be protected from the ultraviolet (UV) radiation of the sun. PC windows can turn yellow after being exposed to the UV radiation in sunlight. The yellow windows suffer from poor transmission of visible light, thus making them unsuitable for architectural or car window applications.

Various conventional deposition techniques have been developed for depositing a coating on a substrate. For example, chemical vapor deposition (CVD) produces a solid film on a substrate surface by thermal activation and surface reaction of gaseous reagents which contain the desired constituents of the film. Energy required to pyrolyze the reactants is supplied by heating the substrate. In order to achieve reasonable reaction rates, the substrate is heated to a relatively high temperature, in the range of about 500–2000° F. These temperatures preclude application of the CVD process to heat sensitive substrate materials such as PC.

Another conventional deposition process, plasma enhanced chemical vapor deposition (PECVD), supplies energy to the reactants by an electrical discharge in a gas which forms a plasma in the deposition chamber. Generally the substrate is immersed in the plasma. The deposition rate, however, is usually low resulting in high process cost.

Physical vapor deposition (PVD) produces solid films by supplying thermal energy in the case of plasma spraying or thermal evaporation, or electrical energy in the case of reactive sputtering or electron beam evaporation. Plasma spray can obtain the rates needed at high temperatures but not at the temperatures where PC is stable. In addition, coatings tend to be highly stressed and porous. Reactive sputtering can be achieved at the desired substrate temperatures, but the deposition rates are too slow for a cost effective process. Thermal or electron beam evaporation can provide high deposition rates, but generally produce coatings with low adhesion due to low energy ions. Thermal and electron beam evaporation are also unable to provide simultaneous coating of two sides of a substrate.

Wire arc deposition is another coating method in which an arc is generated between a cathode and a wire of the material to be deposited. The wire is instantly melted, and the droplets are deposited onto the substrate. This method can deliver high coating rates, but the coatings typically have poor transparency and are porous. The films are also typically relatively thick, e.g. greater than the size of the droplets.

A conventional approach to protection of the PC material is to use an organic UV absorber within a silicone hardcoat. The problem with this approach, however, is that the organic UV absorbers degrade with time, thereby losing their ability to protect the PC.

Other potential UV filter coating materials include zinc oxide (ZnO) and titanium dioxide ($TiO_2$). These materials, however, have been conventionally deposited by sputtering which typically has a very low rate.

In another conventional approach, U.S. Pat. No. 4,871,580 describes a conventional sputtering technique whereby a solid source material is sputtered into a plasma. However, this technique results in a much slower deposition rate, and thus may not be practical for commercial applications.

SUMMARY

In view of the foregoing, it would be desirable to provide a method and apparatus for depositing a coating at a high rate on a substrate.

The present invention provides a method of coating a substrate, comprising the steps of generating a plasma which flows toward the substrate, evaporating a metallic reactant, and introducing the evaporated metallic reactant into the flowing plasma to project the metallic reactant onto the substrate.

The present invention also provides an apparatus for depositing a coating on a substrate comprising a first chamber, an anode and a cathode for generating an arc in the first chamber, a second chamber to house the substrate, the second chamber being in fluid communication with the first chamber, a pump for reducing the pressure in the second chamber to a value below the pressure in the first chamber such that a plasma generated by the anode and the cathode flows into the second chamber toward the substrate, and an evaporator which evaporates a metallic reactant into the flowing plasma.

The present invention also provides an evaporator comprising an evaporator chamber, a heating element in thermal contact with the evaporator chamber, a conduit mounted on the evaporator chamber to provide passage of a metal wire from a wire supply to said evaporator chamber, a motor adapted to feed the metal wire into said evaporator chamber; and a gas supply line coupled to the conduit.

The present invention also provides a method for coating first and second sides of a substrate comprising generating a first plasma which flows toward the first surface of the substrate, generating a second plasma which flows toward the second surface of the substrate, evaporating a metallic reactant introducing the evaporated metallic reactant into the first plasma to project the metallic reactant onto the first surface of the substrate, and introducing a second reactant into the second plasma to project the second reactant onto the second surface of the substrate.

Other features and advantages of the invention, as well as the structure and operation of various embodiments of the invention, are described in detail below with reference to the accompanying drawings.

BRIEF DESCRIPTION OF THE DRAWINGS

FIG. 4 shows a cross-section view of ring-type inlet.

FIG. 5A shows a schematic view of the arc plasma deposition apparatus including an evaporation supply line according to one embodiment of the present invention.

DETAILED DESCRIPTION OF THE PREFERRED EMBODIMENTS

Figure 1:
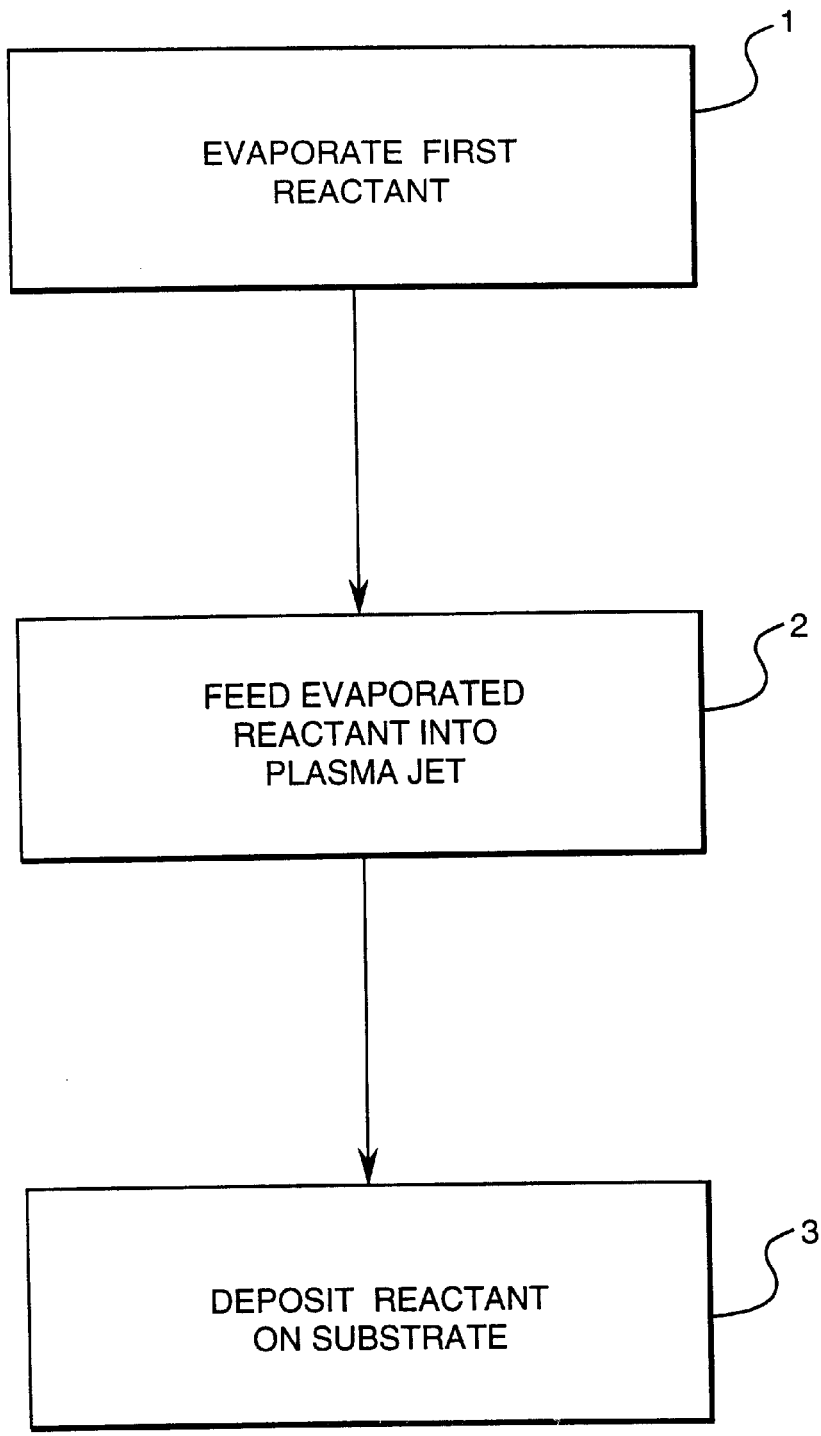
FIG. 1 is flow chart of a method according to one embodiment of the present invention.

The present invention relates to a method for the high rate application of a coating onto a substrate. According to a preferred embodiment, the present invention relates to an arc plasma deposition technique for coating a UV filter material, such as zinc oxide (ZnO), indium zinc oxide (IZO), or aluminum zinc oxide (AZO) onto a glass or a polycarbonate sheet suitable for architectural or automotive glazing applications. This arc plasma deposition technique can yield excellent coating performance with high transparency, high UV absorbency, and low haze. In particular, the chemical stability of this UV filter material is superior to prior ZnO filters and can be improved further by doping the ZnO composition with dopants, such as aluminum or indium, resulting in a coating material having the properties of improved stability, electrical conductivity, and a strong absorption band at about 350 nanometers (nm).

In the preferred arc plasma deposition process, an arc is generated in a first chamber between a cathode and an anode. The anode has a central aperture, typically in the form of a portion of a diverging cone, which opens into a low pressure second chamber. An inert carrier gas, introduced proximate to the cathode, is ionized by the arc between the cathode and anode to form a plasma. The plasma flows into the second chamber at high velocity as a plasma jet due to the pressure difference between the chambers. Upon entering the second chamber, one or more reagents are fed into the plasma, which projects the reagents onto the substrate, and which also enables the reagents to undergo reactions such as polymerization, oxidation, decomposition, etc. The second chamber may include a diverging, e.g. conical, nozzle which extends from the diverging aperture of the anode. The nozzle at its narrow end concentrates the plasma and reagents to enhance chemical reactions and reduce diffusion of the reagents in the second chamber. At the wide end of the nozzle, the area of the plasma is substantially increased to provide a larger deposition area.

The present invention also relates to an apparatus that facilitates the high rate application of a UV filtering coating onto a substrate. In particular, an optically clear adherent coating can be deposited on one or both sides of a substrate using an arc plasma deposition apparatus with an evaporator for evaporating a reactant into the plasma. By utilizing a physical vapor deposition technique in combination with an arc plasma deposition process, a zinc-based coating can be deposited onto the substrate at a controllable but sufficiently high rate. The resulting coated substrate has the characteristics of good transparency, good chemical stability, low haze, and high UV absorbency and/or infrared (IR) reflection.

One embodiment provides a ZnO coating doped with indium (In) or aluminum (Al) that can be deposited at a high rate by a combined thermal evaporation and arc plasma deposition process. This method results in the formation of a transparent, electrically conductive, UV filter on a surface of the substrate. A polycarbonate (PC) substrate coated with ZnO can have an absorbency value in the UV (e.g., at 350 nanometers) from about 1.22 to about 4.55, for example. Absorbency (also referred to as "optical density" or "OD") is defined as $\log(I_i/I_o)$, where $I_i$ is the intensity of incident light on the layer and $I_o$ is the output intensity. Unless otherwise specified the wavelength of light at which optical density is measured is 350 nm.

An embodiment of a method of coating a substrate according to the present invention is shown in FIG. 1. In step 1, a first reactant is evaporated. In step 2, the evaporated reactant is introduced or fed into a plasma jet. In step 3, the evaporated reactant is deposited on a surface of the substrate.

According to one embodiment of the present invention that produces acceptable results, step 1 can be achieved by a physical vapor deposition (PVD) technique. PVD techniques include thermal evaporation and sputtering techniques. The basic mechanism of PVD is an atom-by-atom transfer of material from the solid phase to the vapor phase and back to the solid phase upon deposition on a substrate surface. For example, in one thermal evaporation technique, a substance, such as a metal, is placed in a crucible and heated to a high temperature near or above the melting point temperature of the substance. This heating creates a vapor that contains a gaseous phase of the original solid substance. This reactant can then be introduced or fed into a plasma in step 2.

In particular, the first reactant of step 1 can be a metal. Preferably, for coatings that filter UV radiation and/or reflect infrared (IR) radiation, the metal is selected from a group that includes zinc (Zn), zinc alloys, indium (In), titanium (Ti), cerium (Ce), and aluminum (Al). Zn is preferred for purposes of the present invention because of its absorption characteristics in the ultraviolet (UV) region of the electromagnetic spectrum. Zn is also acceptable for purposes of the present invention due to its melting point temperature and vapor pressure characteristics. The method of FIG. 1 can also be utilized for depositing coatings for other applications. For example, metals such as Al and silver (Ag), utilized to filter out IR radiation, may also be deposited by the method of the present invention, as described in U.S. Pat. No. 6,261,694 entitled "Infrared Reflecting Coatings", by Iacovangelo, filed on the same day as the present application, which is hereby incorporated by reference.

In one embodiment of the present invention that produces acceptable results, an evaporator comprises a metal crucible. For example, a nickel crucible with a tantalum (Ta) liner can be utilized as a suitable evaporator. The crucible can be wrapped with a heating element to control its temperature. The crucible is used to heat a metal reactant, such as Zn or a Zn alloy. Other metals with similar UV absorption characteristics can also be utilized in the method of the present invention as would be apparent to one of skill in the art given the present description.

According to one embodiment of the present invention that produces acceptable results, step 1 can further include the step of controlling the vapor pressure of the reactant. It has been observed that the vapor pressure of the reactant plays an important role in optimizing a coating deposition run. By controlling the vapor pressure, the deposition rate of the reactant onto the substrate can be more precisely controlled. One way to control the vapor pressure is to monitor and vary the temperature of the crucible. For example, as the vapor pressure of Zn is increased, more Zn is available for delivery into the plasma. With more Zn being delivered to the plasma, a high deposition rate of a Zn-based coating compound can be achieved. For example, when Zn has a vapor pressure of 100 milliTorr, it has a corresponding melting point of 405 degrees centigrade. Other metals, with similar vapor pressure characteristics, can be utilized in the method of the present invention.

According to one embodiment of the present invention that produces acceptable results, step 2 can be achieved by introducing, injecting or feeding the evaporated reactant directly into a plasma via a reactant or reagent supply line. In one embodiment of the present invention, the plasma comprises a plasma stream or plasma jet. A first inlet or opening can be provided to allow the flow of the first reactant into the plasma. The plasma can be created by a plasma generator, as discussed below. The first inlet can be located at or in close proximity to the anode of the plasma generator or, alternatively, at a distal point from the plasma generator. For example, the first inlet can be used to introduce an evaporated metal such as zinc to the plasma jet.

In addition, a second inlet can be located at or in close proximity to the anode of the plasma generator or, alternatively, at a distal point from the plasma generator. This second inlet can be used to introduce a second reactant, e.g. an oxidant such as oxygen, sulfur, or nitrous oxide to the plasma jet. For example, when forming ZnO, the Zn vapor reactant enters the plasma and reacts with the oxygen supplied to the plasma. Oxygen is ionized by electron impact collisions or collisions with ionized inert gases, such as Argon (Ar), comprising the plasma or carrier gas. This composition is then transported by the plasma jet toward the substrate. This composition is then deposited on the substrate in step 3.

The substrate, according to exemplary embodiments of the invention, typically comprises a polymer resin. For example, the substrate may comprise a polycarbonate. Polycarbonates suitable for forming the substrate are well-known in the art and generally comprise repeating units of the formula:

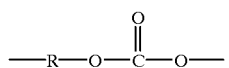

where R is a divalent aromatic radical of a dihydric phenol (e.g., a radical of 2,2-bis(4-hydroxyphenyl)-propane, also known as bisphenol A) employed in the polymer producing reaction; or an organic polycarboxylic acid (e.g. terphthalic acid, isophthalic acid, hexahydrophthalic acid, adipic acid, sebacic acid, dodecanedioic acid, and the like). These polycarbonate resins are aromatic carbonate polymers which may be prepared by reacting one or more dihydric phenols with a carbonate precursor such as phosgene, a haloformate or a carbonate ester. One example of a polycarbonate which can be used is LEXAN®, manufactured by the General Electric Company.

Aromatic carbonate polymers may be prepared by methods well known in the art as described, for example, in U.S. Pat. Nos. 3,161,615; 3,220,973; 3,312,659; 3,312,660; 3,313,777; 3,666,614; 3,989,672; 4,200,681; 4,842,941; and 4,210,699, all of which are incorporated herein by reference.

The substrate may also comprise a polyestercarbonate which can be prepared by reacting a carbonate precursor, a dihydric phenol, and a dicarboxylic acid or ester forming derivative thereof. Polyestercarbonates are described, for example, in U.S. Pat. Nos. 4,454,275; 5,510,448; 4,194,038; and 5,463,013.

The substrate may also comprise a thermoplastic or thermoset material. Examples of suitable thermoplastic materials include polyethylene, polypropylene, polystyrene, polyvinylacetate, polyvinylalcohol, polyvinylacetal, polymethacrylate ester, polyacrylic acids, polyether, polyester, polycarbonate, cellulous resin, polyacrylonitrile, polyamide, polyimide, polyvinylchloride, fluorine containing resins and polysulfone. Examples of suitable thermoset materials include epoxy and urea melamine.

Acrylic polymers, also well known in the art, are another material from which the substrate may be formed. Acrylic polymers can be prepared from monomers such as methyl acrylate, acrylic acid, methacrylic acid, methyl methacrylate, butyl methacrylate, cyclohexyl methacrylate, and the like. Substituted acrylates and methacrylates, such as hydroxyethyl acrylate, hydroxybutyl acrylate, 2-ethylhexylacrylate, and n-butylacrylate may also be used.

Polyesters can also be used to form the substrate. Polyesters are well-known in the art, and may be prepared by the polyesterification of organic polycarboxylic acids (e.g., phthalic acid, hexahydrophthalic acid, adipic acid, maleic acid, terphthalic acid, isophthalic acid, sebacic acid, dodecanedioic acid, and the like) or their anhydrides with organic polyols containing primary or secondary hydroxyl groups (e.g., ethylene glycol, butylene glycol, neopentyl glycol, and cyclohexanedimethanol).

Polyurethanes are another class of materials which can be used to form the substrate. Polyurethanes are well-known in the art, and are prepared by the reaction of a polyisocyanate and a polyol. Examples of useful polyisocyanates include hexamethylene diisocyanate, toluene diisocyanate, MDI, isophorone diisocyanate, and biurets and triisocyanurates of these diisocyanates. Examples of useful polyols include low molecular weight aliphatic polyols, polyester polyols, polyether polyols, fatty alcohols, and the like.

Examples of other materials from which the substrate may be formed include acrylonitrile-butadiene-styrene, glass, VALOX® (polybutylenephthalate, available from General Electric Co.), XENOY® (a blend of LEXAN® and VALOX®, available from General Electric Co.), polyestercarbonate (PPC), polyethersulfone (PES) (sold under the trademark "Radel®" by Amoco), polyetherimide (PEI or polyimide) (sold under the trademark "Ultem®" by the General Electric Company), and the like.

The substrate can be precoated with a silicone hardcoat or a polymerized organosilicon layer, for example. Examples of silicone hardcoats are described in U.S. Pat. No. 4,842, 941, which is hereby incorporated by reference. A polycarbonate sheet coated with a silicone hardcoat is also available as MR7 from the General Electric Company. Examples of polymerized organosilicon layers are described in U.S. Ser. No. 09/271,654, entitled "Multilayer Article and Method of Making by Arc Plasma Deposition", by Iacovangelo et al., filed on the same day as the present application, which is hereby incorporated by reference.

The substrate can be formed in a conventional manner, for example by injection molding, extrusion, cold forming, vacuum forming, blow molding, compression molding, transfer molding, thermal forming, and the like. The article may be in any shape and need not be a finished article of commerce, that is, it may be sheet material or film which would be cut or sized or mechanically shaped into a finished article. The substrate may be rigid or flexible. The substrate may be transparent or not transparent.

According to another embodiment of the present invention that produces acceptable results, step 2 can also be achieved by feeding several reactants directly into a plasma via a number of reagent supply lines and corresponding inlets or openings, which can be operated individually or in combination. Separate inlets can be provided for each of the reactants to be deposited on the substrate. In one exemplary embodiment, a first inlet allows the flow of evaporated Zn or Zn-alloy into the plasma, a second inlet allows the flow of oxygen ($O_2$) into the plasma, and a third inlet allows the flow of evaporated indium or aluminum into the plasma. These reactants then combine or react in the plasma to form a compound that is deposited on the substrate. In this example, the compound In:ZnO (IZO) or Al:ZnO (AZO) is formed in the plasma and is deposited onto the substrate. Other gas reactants and solid reactants can be utilized as will be apparent to those of skill in the art.

In one embodiment of the method of the present invention that produces acceptable results, prior to initiating deposition, the substrate is mounted on a support in a second chamber. A carrier or plasma gas, such as Ar, is introduced into a first chamber containing a cathode and an anode adjacent the first chamber, which may include an aperture. Other inert gases, such as noble gases or nitrogen can be utilized to generate the plasma. The pressure in the first chamber is reduced below the pressure in the second chamber. A potential difference is then applied between the cathode and the anode. As a result, a carrier gas plasma arc or jet is created that extends from the second chamber to the substrate in the first chamber through the aperture in the anode.

Alternatively, step 1 can either be modified or avoided altogether by utilizing an organometallic source for Zn, In, and/or Al in addition to or instead of the evaporation technique. For example, organometallic sources such as diethyl zinc (DEZ), dimethyl zinc (DMZ), triethyl indium (TEI), trimethyl indium (TMI), triethyl aluminum (TEA), and trimethyl aluminum (TMA), and the like, can be injected into the oxygen argon plasma in step 2. The organometallics are broken down by the plasma energy and are reacted with the ionized oxygen to form ZnO, IZO, or AZO.

Figure 2:
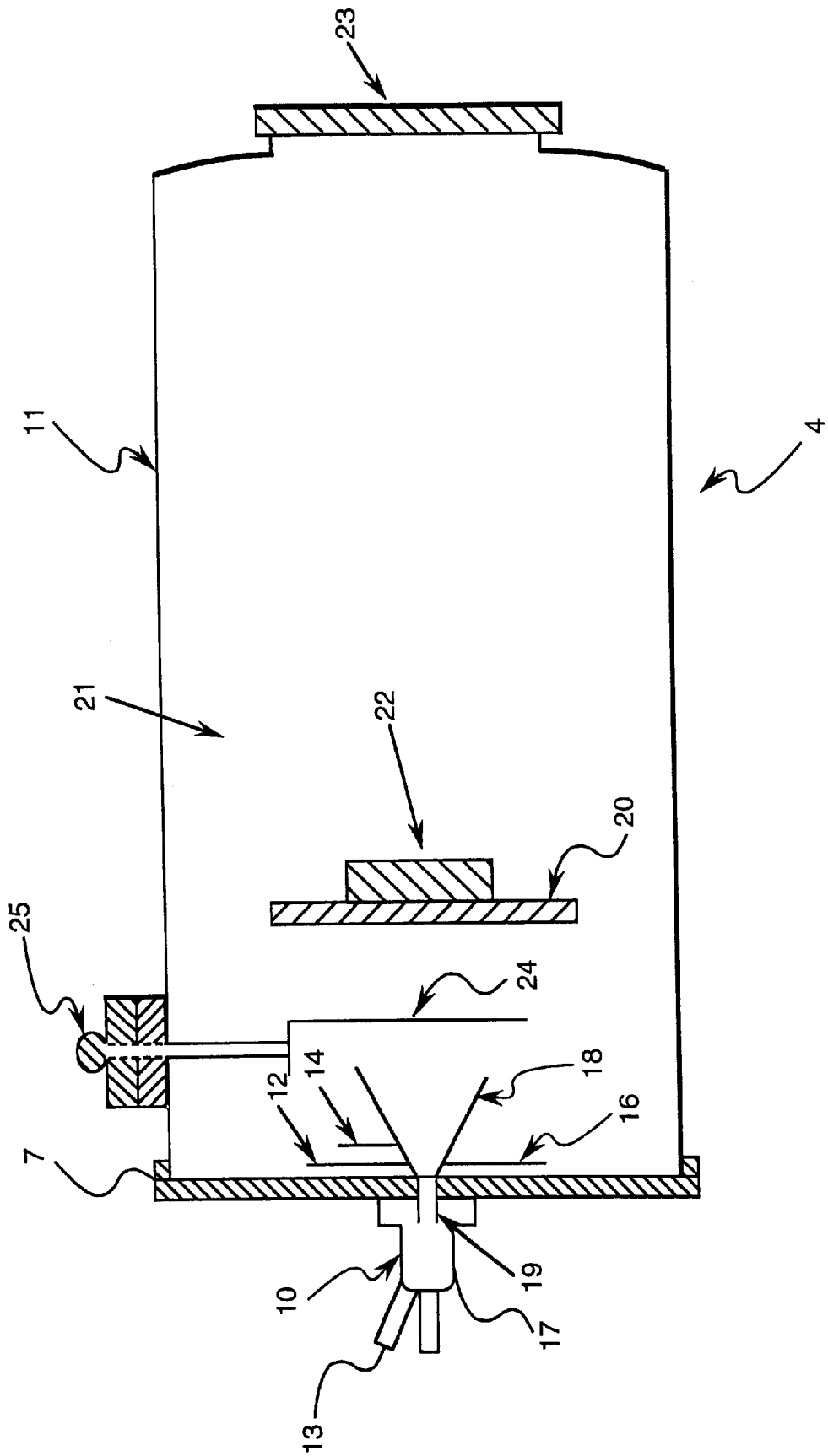
FIG. 2 is a schematic cross-section of an example arc plasma deposition apparatus according to one embodiment of the present invention.

Referring now to FIG. 2, an embodiment of the present invention is schematically shown as an arc plasma deposition apparatus 4. The arc plasma deposition apparatus 4 comprises a plasma generation chamber 10 (also referred to as a plasma generator) and a deposition (or treatment) chamber 11. The deposition chamber 11 contains a substrate 20 mounted on a temperature controlled support 22.

The deposition chamber also contains an outlet 23 for pumping and a door 7 for loading and unloading the substrate 20. Door 7 may be mounted on a hinge to swing open and is preferably placed in the front of the deposition chamber where the plasma generation chamber 10 is mounted. The support 22 may be positioned at any position in area 21 of chamber 11. According to one embodiment that produces acceptable results, the substrate 20 is positioned at a distance of about 15 centimeters (cm) to about 70 cm from the anode 19. Preferably, the substrate is positioned about 25 cm from anode 19. The substrate is typically perpendicular to the flow of the plasma jet.

Chamber 11 also optionally comprises a retractable shutter 24. The shutter may be positioned by a handle 25 or by a computer controlled positioning mechanism. The shutter 24 may also contain a circular aperture to control the diameter of the plasma that emanates from the plasma generation chamber 10 towards the substrate 20. Chamber 11 may also optionally comprise magnets or magnetic field generating coils (not shown) adjacent to chamber walls to direct the flow of the plasma.

Optionally, chamber 11 may also contain a nozzle 18. According to the present invention, nozzle 18 can be designed either with or without one or more injectors incorporated in its design. The combination of the nozzle and the injectors is sometimes referred to herein as an injection nozzle or nozzle-injector.

Nozzle 18 allows an improved control of the injection, ionization and reaction of the reactants to be deposited on the substrate 20. In addition, the nozzle 18 helps define a suitable confinement area in which the reaction takes place. The nozzle 18 assures the deposition of the coating composition on the substrate 20 and prevents formation of powdery reactant deposits on the substrate 20.

Nozzle 18 can be either cylindrical or conical in shape. Preferably, the nozzle 18 has a conical shape with a divergent angle (measured from one inside surface to the opposite inside surface) of about 40 degrees and a length defined along the central axis of the cone of about 16 cm. However, nozzle 18 may have a variable cross section, such as conical-cylindrical-conical or conical-cylindrical. Furthermore, the nozzle 18 may have a divergent angle either greater than or less than 40 degrees and a length other than 16 cm. For example, the divergent angle of nozzle 18 may range from greater than 0 degrees to about 60 degrees to produce acceptable results. The nozzle may also be omitted entirely, as would be apparent to one of skill in the art given the present description.

The specific shape of the nozzle 18 can also be varied in order to optimize the extent of reaction, the coating area, and/or the thermal load on the substrate. For example, nozzle 18 can be designed, as shown in FIG. 2, with a diverging (or conical) shape. This conical shape provides for a larger coating area onto the substrate. As an example, optically clear coatings (i.e., not partially opaque due to a powder-like coating on the surface of the substrate) of about 30 centimeters in diameter have been deposited on a PC substrate.

Nozzle 18 can comprise stainless steel, or any other metal, such as tungsten, or other group V-VI metals, that can withstand high operating temperatures without melting. Alternatively, nozzle 18 can comprise a ceramic or the like, which can withstand extremely high operating temperatures.

The nozzle 18 can be designed to be suitable for use with a variety of plasma generating devices. For example, nozzle 18 can be utilized in a wall stabilized arc plasma torch having at least one electrically isolated plate located between the cathode and the anode. Alternatively, nozzle 18 can be designed to be suitable for use with multi-plate wall stabilized arc devices, such as described in U.S. Pat. Nos. 4,948,485 and 4,957,062, each hereby incorporated by reference in their entirety.

Chamber 11 also contains at least one reactant supply line. For example, chamber 11 may contain a first supply line 12 (e.g., for oxygen) and a second supply line 14 (e.g., for zinc) to deposit a ZnO film on the substrate 20. Chamber 11 may also include a third supply line 16 to introduce another reactant, such as indium or aluminum, to the plasma stream in order to deposit IZO or AZO on the substrate. The supply lines 12, 14, 16 preferably communicate with the nozzle 18 and supply reactants into the plasma flowing through the nozzle 18. Chamber 11 also contains vacuum pumps (not shown) for evacuating the chamber.

Figure 3:
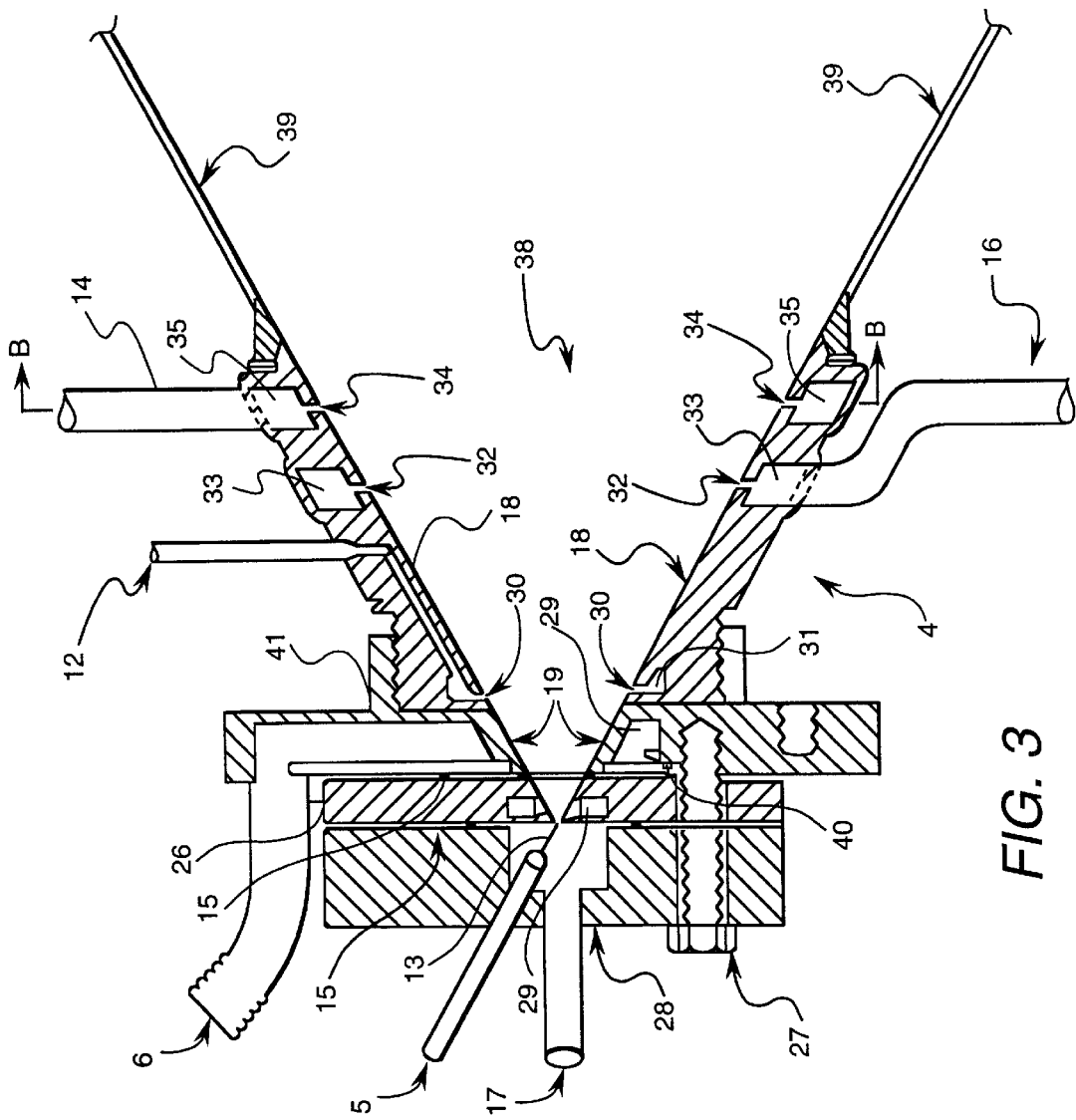
FIG. 3 is a cross-section view of a plasma generator and a nozzle according to one embodiment of the present invention.

Chamber 10 is shown in more detail in FIG. 3. The plasma generation chamber 10 contains at least one cathode 13, a plasma gas supply line 17 and an anode 19. Chamber 10 typically comprises more than one cathode 13. Advantageously, there are three cathodes 13. The cathodes 13 may comprise tungsten or thorium doped tungsten tips. The added thorium allows the temperature of the tips to be maintained below the melting point of tungsten, thus avoiding contamination of the plasma with tungsten atoms. The cathodes 13 may be surrounded by a cathode housing 5 to isolate each cathode 13 from the walls of the cathode support plate 28 and to provide for water cooling. The cathode housing 5 may comprise a shell surrounding an isolating mantle made from an insulating material such as quartz.

The cathodes 13 are separated from the anode 19 by at least one cascade plate 26. The cascade plate(s) preferably comprise copper discs containing a central aperture having a shape which corresponds to the shape of the anode aperture.

Figure 9:
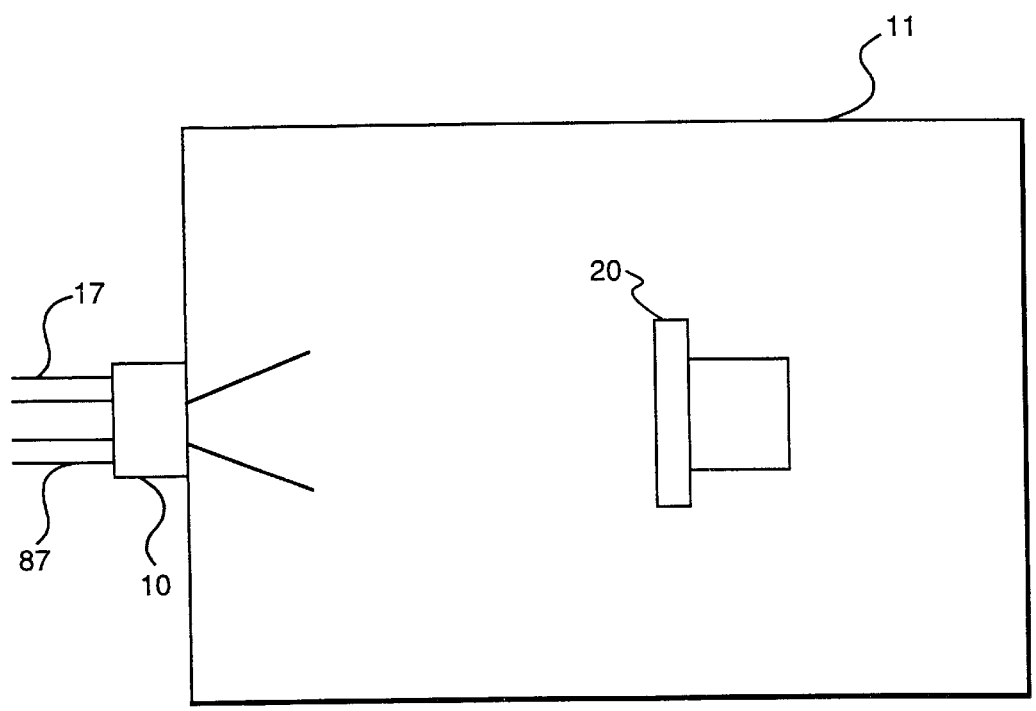
FIG. 9 shows a schematic view of the arc plasma deposition apparatus including a purging system according to an alternative embodiment of the present invention.

Chamber 10 also contains at least one plasma gas supply line 17. Optionally, chamber 10 may also contain a purging gas supply line adjacent to the plasma gas supply line 17 to supply a purging or flushing gas to chambers 10 and 11 prior to supplying a plasma gas, as shown in FIG. 9. For example, as shown in FIG. 9, if a liquid or gas-like reactant is used, injection of the reactant can also take place in the plasma generation chamber 10 via supply line 17, while a purging or flushing gas can be injected via supply line 87, in order to facilitate continuous flushing of the reactor. The flushing gas comprises a single gas or a multiple gas mixture that does not release any fragments after separation that could damage the parts of the plasma generator. For example, inert gases, such as Ar, or gases such as hydrogen, can be utilized as the flushing gas.

Referring again to FIG. 3, to form a plasma in chamber 10, a plasma gas can be supplied through plasma gas supply line 17. The plasma gas may comprise a noble gas, nitrogen, ammonia, carbon dioxide, nitrous oxide, sulfur, or hydrogen, for example, or any combination thereof. If there is more than one plasma gas, then the plural gasses may be supplied through plural supply lines. Preferably, the plasma gas comprises argon or a combination of argon and oxygen. The plasma gas in plasma generation chamber 10 is maintained at a higher pressure than the pressure in the deposition chamber 11, which is continuously evacuated by a pump. An arc voltage is then applied between the cathode(s) 13 and the anode 19 to generate a plasma in the chamber 10. The plasma is then emitted as a supersonic plasma (also referred to as a plasma jet or plasma stream) through the anode 19 aperture into the deposition chamber 11 due to the pressure difference between chambers 10 and 11. The volume through which the plasma flows from the chamber 10 into chamber 11 is also referred to herein as the plasma channel.

The cathode support plate 28 is attached to the cascade plate(s) 26 and the anode 19 by an insulated bolt 27 or by other fasteners. The cascade plate 26 is electrically insulated from the cathode support plate 28 and the anode 19 by spacers 15. Spacers 15 comprise an electrically insulating material that can withstand the elevated temperatures. For example, spacers 15 may comprise O-ring vacuum seals, polyvinylchloride rings, boron nitride rings, or the like.

Plasma discharge at high power density and high temperature tends to heat the cascade plate(s) 26 and anode 19.

Preferably, the cascade plate(s) 26 and anode 19 contain coolant channels 29 and 40, respectively. The channels 29, 40 typically have a circular shape within the bulk of the plate(s) 26 and anode 19, as shown in FIG. 3. Coolant, such as chilled water supplied through a water supply line 6 flows through the channel 40 to cool the anode 19 during operation. A similar water supply line (not shown) is provided to supply water to the channel 29.

Nozzle 18 is preferably attached to (or mounted on) anode 19. For example, as shown in FIG. 3, nozzle 18 can be securely mounted onto anode 19. In this example, nozzle 18 is screwed into the support portion 41 of anode 19 to provide a flush fit. Other means of mounting nozzle 18 to anode 19 will be apparent to one of skill in the art given the present description. Alternatively, nozzle 18 can be formed onto anode 19 as one contiguous unit.

Nozzle 18 can optionally further include an integral or removable divergent portion, referred to as a nozzle extension 39, for confinement and further directing of the plasma and reactive species flow. Further confinement provided by the nozzle extension 39 helps to ensure the recirculation of the reactants within the plasma stream by preventing reactants from becoming too diffuse in the chamber. In addition, extension nozzle 39 can include an additional reactant supply line and inlet (not shown), for introducing an additional reactant to the plasma. For example, an additional reactant, such as sulfur or a mixed oxysulfide, can be introduced to the plasma stream at an inlet(s) located within nozzle extension 39.

As shown in the example embodiment of FIG. 3, the nozzle 18 has a substantially similar degree of divergence (or expansion) as the cascade plate 26 and the anode 19. As shown in FIG. 3, anode 19 can be configured as a conical-shaped nozzle. Alternatively, the nozzle 18 can vary according to the shape and geometry of the anode. In yet a further alternative embodiment, nozzle 18 can have a flared or bell-shaped mouth at its distal end (the end furthest from anode 19). Various shapes can be utilized depending on the desired coating characteristics. Similarly, anode 19 can also have a variety of shapes. Secured mounting for the anode can be achieved using one or more securing screws to mount the cathode housing to the cascade plates and anode.

The exemplary nozzle 18 shown in the embodiment of FIG. 3 also provides for an increased deposition rate. For example, shower-ring or slit injectors can be built into the nozzle for the delivery of gas and/or vapor reactants. The locations of the injectors can affect the degree of gas ionization, which can affect the extent of reaction of the reactants fed into the plasma. In turn, the locations of the reactant inlets can affect the chemical stoichiometry and structure of the coating deposited on the substrate.

For example, according to one embodiment of the present invention that yields acceptable results, an inlet supplying an oxygen reactant, or the like, to the plasma stream is located on the nozzle 18 adjacent to the anode 19.

Preferably, the reactant supply line(s) 12, 14 and 16 are in fluid communication with the nozzle 18. In this embodiment of the present invention, nozzle 18 includes one or more injectors coupled to the reactant supply line(s) 12, 14, and 16 providing for the delivery of the reactants into the plasma. The injectors may include ring shaped reactant supply channels connected to injection holes or a slit shaped injector. For example, as shown in FIG. 4, reactant supply line 14 connects to reactant supply channel 35 formed inside the body of nozzle 18. Reactant supply channel 35 contains a plurality of openings 34, which are preferably evenly distributed around the circumference of channel 35. The reactant flows from line 14 into the channel 35. The reactant then flows from the channel 35 simultaneously through openings 34 into deposition chamber space 21 from several directions. Likewise, as shown in FIG. 3, supply line 16 is connected to channel 33 and openings 32 and supply line 12 is connected to channel 31 and openings 30. Alternatively, the channel and openings may be omitted and the supply lines may deposit the reactants directly into the plasma.

The reactants are supplied into the plasma through supply line(s) 12, 14, 16. For example, oxygen gas may be supplied through line 12, zinc may be supplied through line 14, and indium may be supplied through line 16 to form an IZO film on substrate 20. However, line 16 may be sealed if a ZnO film is to be deposited. Zinc and indium (and/or aluminum) may be supplied through the same line (14 or 16). Of course the supply line location may be altered, and oxygen may be supplied through line 14 or 16 and evaporated zinc reactant through line 12. This arrangement, in which oxygen is supplied downstream from the Zn reactant, helps reduce the risk of ZnO forming on the Zn reactant injection holes or inlets. Furthermore, one or more additional supply lines can be connected to nozzle 18 and/or nozzle extension 39, to provide additional reactants and/or dopants to the plasma stream.

Alternatively, the oxygen can be fed through the reactant supply line 14 which feeds openings (or injection holes) 34 through channel 35. Supply line 14 can also be used to feed reactants for doping the ZnO; e.g. TMA or TEA for aluminum or TEI or TMI for indium, or TMDSO or $SiH_4$ for Si.

Preferably, the zinc, indium and/or aluminum reactants are supplied to the plasma in the form of a vapor. For example, as discussed in the example section below, ZnO and IZO coatings can be deposited onto a PC substrate at high rates by thermally evaporating Zn into the plasma. Oxygen and Zn can be reacted in the Ar plasma to form a substantially transparent ZnO layer on the substrate. Indium can be added to form an IZO layer. Additional reactants or dopants, such as sulfur can also be mixed into the coating composition to provide user desired results, such as forming a ZnS layer.

According to an embodiment of the present invention that produces acceptable results, metals having relatively low melting point temperatures are chosen. Metals having higher melting point temperatures can be utilized, however the temperature of the nozzle should be kept at an even higher temperature. If metals having higher melting point temperatures are chosen as a coating constituent, this choice may limit the types materials that can be utilized to form the injection nozzle.

In one embodiment of the present invention, an exemplary injection nozzle configuration and structure includes both cylindrical and conical plasma channels and a two-stage conical channel with a cylindrical section in between. The angle of divergence of the injection nozzle can range from 0 degrees to about 60 degrees, for example. The opening of the plasma channel (i.e., the anode aperture) at the base of the anode can range from about 4 to about 7 mm in diameter. Alternatively, smaller diameter plasma channels can be used to coat small objects. The length of the example injection nozzle can range from about 1.5 cm to about 25 cm, thereby controlling the volume of the zone (within the plasma) in which the reaction of the constituent reactants can take place. The injection nozzle can also be a single integral construction. Furthermore, the nozzle extension 39 can also be incorporated into nozzle 18 as a single integral construction.

Alternatively, the injection nozzle can be assembled from parts such as a stainless steel main body with injectors or inlets for introducing or feeding the reactants into the plasma, a copper or other metal adapter (not shown) for mounting nozzle 18 to the plasma generator, and a nozzle extension 39 attached to the downstream end of the main body to provide a suitable volume for the reaction zone which exists within the injection nozzle. Further, an inlet, such as a ring injector, can be built into the copper adapter for oxygen injection. The copper adapter can be plated, such as with nickel (Ni), gold (Au), or rhodium (Rh) plating, to resist oxidation. This modular design takes into account the effect of nozzle size and reactant injection position in order to optimize the reaction of the coating constituents. This modular approach eliminates the need for separate direction control and reactant injection units.

To generate a metal vapor, the metal supply line may be altered as shown in FIG. 5A. The metal supply line 14 (or 12 or 16, as necessary) is replaced by a conduit or tube 44, such as a stainless steel tube. The tube 44 is attached to an evaporator 45. In this example, evaporator 45 comprises a crucible, such as a nickel crucible with a tantalum liner. The crucible is surrounded by a heating element 47, such as a high resistance wire or radio frequency (RF) coils. The heating element is also wrapped around the tube 44. The heating element is kept at a temperature sufficient to prevent the reactant metal from solidifying in the tube 44. Preferably, the heating element 47 also extends to the nozzle 18 to prevent the metal from solidifying therein. For example, the nozzle 18 can be thermal wrapped to maintain a temperature above the melting point of a vapor reactant to prevent clogging, such as if the vapor were cooled to the point where the reactant returned to its solid phase.

The metal reactant 48 is loaded into the evaporator 45 such that the reactant abuts the pipe 44. The heating element is activated to evaporate the metal reactant 48 into the pipe 44. The metal reactant is then fed into the plasma 50 from pipe 44 through channel 35 and openings 34. For example, to deposit a ZnO film, the metal reactant is zinc, which is commercially available in the form of Zn slugs. To deposit an IZO film, the metal reactant 48 may be a In:Zn alloy, such as 2.5 atomic % In:Zn.

Alternatively, indium vapor may be supplied through a separate conduit than the zinc vapor. In this embodiment, the second metal supply line 16 is replaced with a second tube 46 and a second crucible containing indium. The zinc and/or indium vapor enter the plasma, where its mixes with oxygen supplied through supply line 12. The metal and oxygen reactants mix in the plasma 50 to form ZnO or IZO which deposits on the substrate 20 as a thin film as the plasma strikes the substrate.

Alternatively, organometallics, such as diethyl zinc (DEZ), dimethyl zinc (DMZ), triethyl indium (TEI), trimethyl indium (TMI), trimethyl aluminum (TMA), and triethyl aluminum (TEA), and the like, can be utilized as sources for reactants that are introduced into the plasma stream. These reactants can be introduced into the plasma stream via, for example, supply line 16.

Figure 5B:
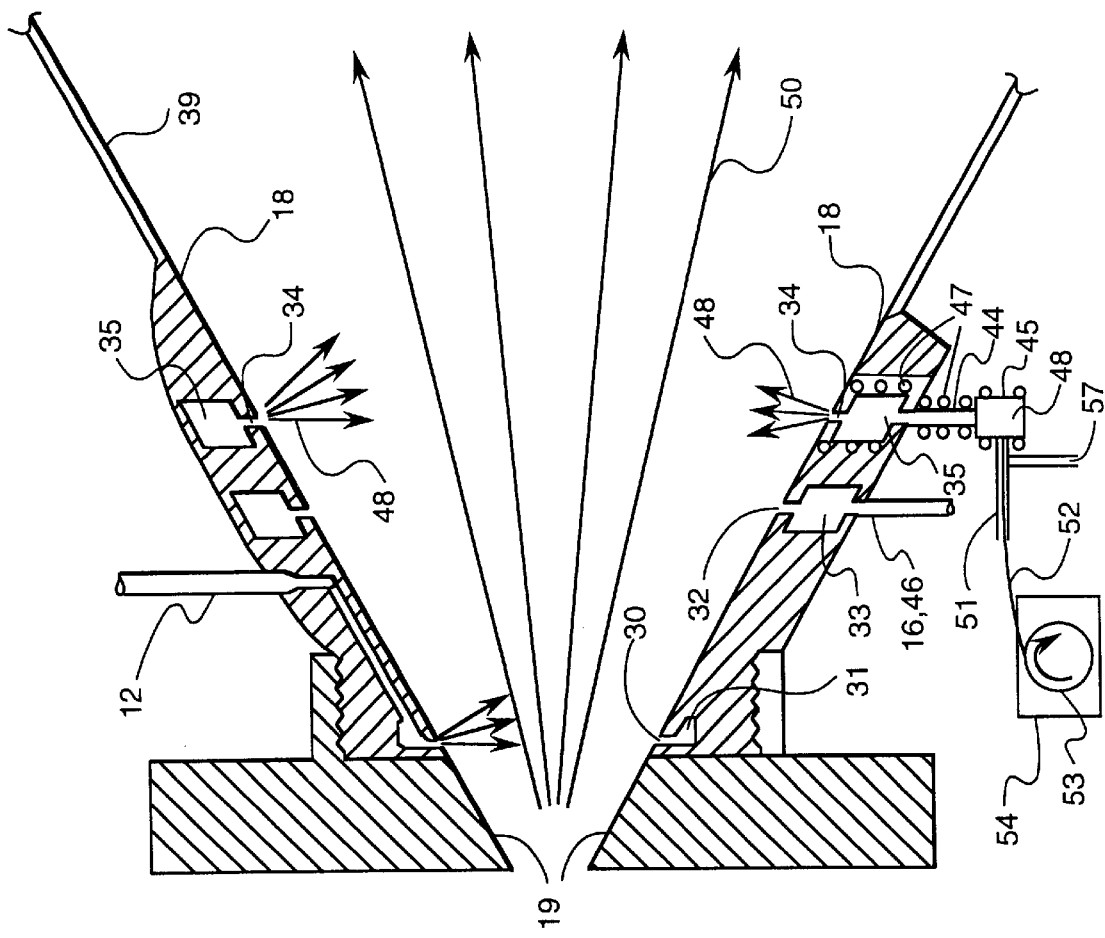
FIG. 5B shows a schematic view of the arc plasma deposition apparatus including a modified evaporator according to one embodiment of the present invention.

Another embodiment of the present invention is shown in FIG. 5B. As discussed above, the metal reactant, such as Zn, is melted in evaporator 45, which comprises an evaporation chamber. Evaporator 45 is connected to conduit 44 to provide a flow of the evaporated reactant to injection holes 34. In this embodiment, instead of using a Zn slug, for example, a Zn wire 52 is fed to the evaporator 45 through a wire feed conduit or hollow tube 51 connected to a wire feed supply 53, such as a spool of Zn wire. Of course, other metals can be utilized as the metal reactant, as described above.

Wire feed supply 53 can be unspooled by a conventional motor 54. In one embodiment, a motor 54 is driven at a constant rate to continuously feed wire 52 into evaporator 45. In addition, Ar gas can be fed through conduit 51 via tube 57. Argon is used to reduce back diffusion of oxygen, to carry the zinc vapors, and to dilute the zinc activity at the entrance to the plasma at injection holes 34.

The two embodiments shown in FIGS. 5A and 5B also illustrate two modes of operation that produce acceptable results. For example, the arc plasma deposition apparatus of the present invention can be used in a batch mode. In the batch mode, a metal reactant, such as a slug of Zn or In:Zn is placed within evaporator 45. Nozzle 18 is brought to thermal equilibrium while the evaporator is rapidly cycled up and down to start and stop reactant deposition. Alternatively, in a continuous mode, the evaporator 45 and nozzle 18 are brought to equilibrium via heating element 47. Wire 52 is fed into the evaporator 45 where it melts and evaporates into the plasma 50 at a constant rate proportional to the feed rate of the wire and the vapor pressure of the reactant at the evaporator temperature. The continuous mode is advantageous in that it minimizes any waste of the evaporated reactant. The evaporator can be kept at the proper elevated temperature for as long as a user desires. The feed rate of the reactant wire can also be varied accordingly. Of course, variations or combinations of these modes of operation can also be utilized to produce acceptable deposition runs, as will be apparent to those of skill in the art given the present description.

Figure 6:
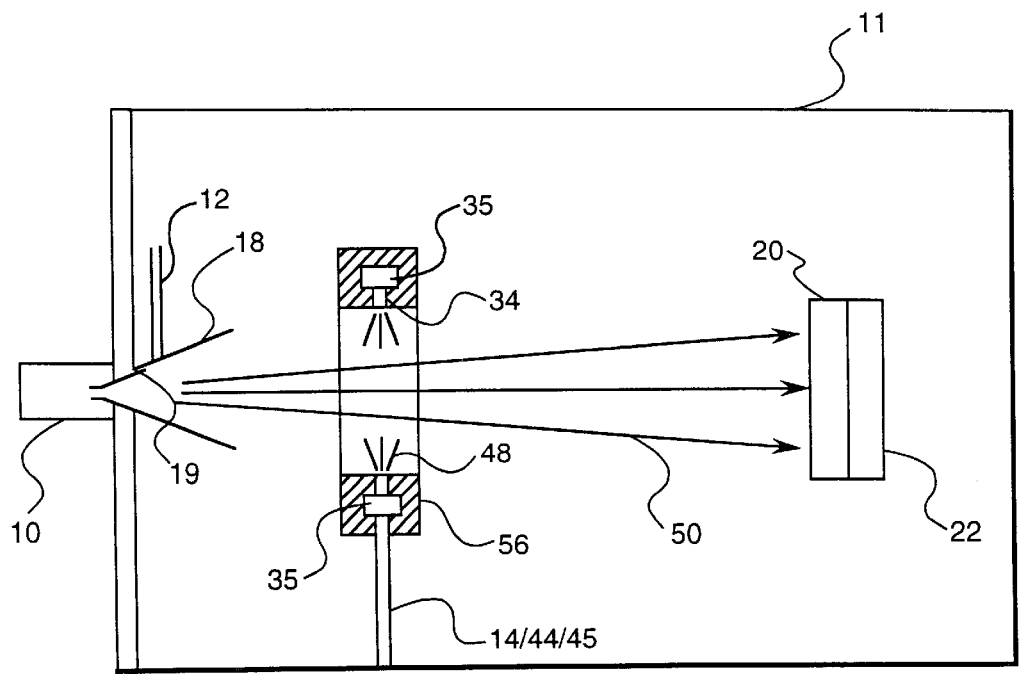
FIG. 6 shows a schematic view of the arc plasma deposition apparatus including a distal evaporation inlet according to an alternative embodiment of the present invention.

In an alternative embodiment, at least one reactant inlet, such as a metal reactant inlet 56 is located distal from the anode 19, as shown in FIG. 6. Inlet 56 can be provided on a nozzle extension or at some further downstream area. The inlet 56 may have a ring shape with a wide aperture in the center of the ring. The inlet preferably contains a reactant supply channel 35 and reactant supply openings 34 similarly to the previous embodiment. The plasma 50 passes through the aperture in the inlet 56. The reactant is supplied to channel 35 through a supply line 14 if the reactant is a gas or through a pipe 44 and crucible 45 if the reactant is a vapor. The reactant 48 enters the plasma 50 from plural openings 34. In this embodiment, the nozzle 18 may be omitted because the inlet 56 controls the shape and direction of the plasma 50, as well as the reaction zone.

Figure 7:
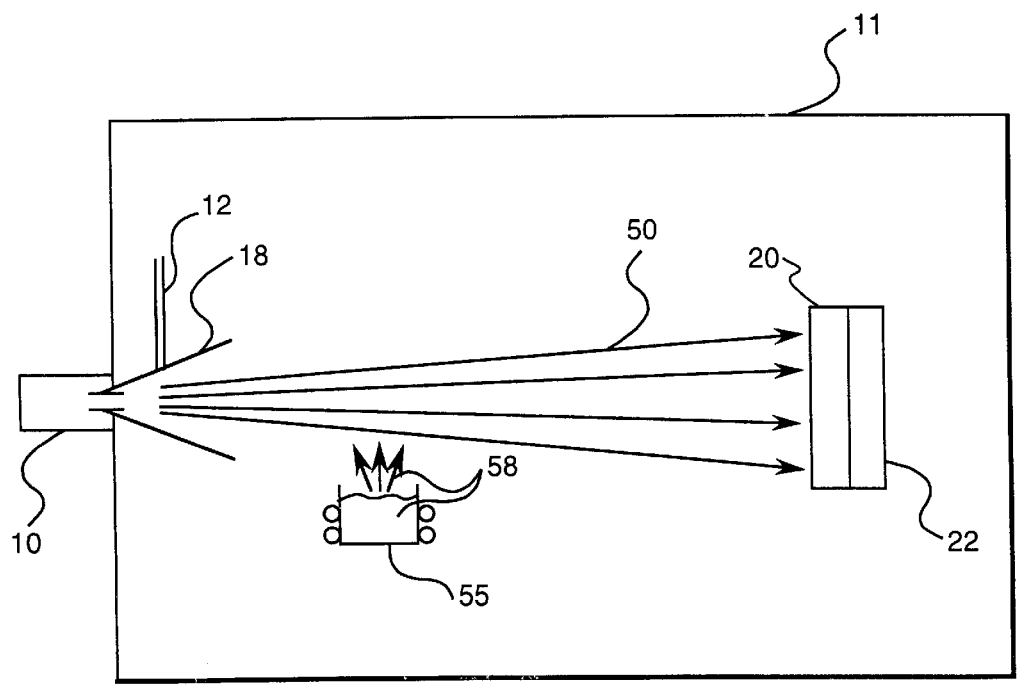
FIG. 7 shows a schematic view of the arc plasma deposition apparatus including a crucible inlet according to an alternative embodiment of the present invention.

In another embodiment, the reactant inlet may comprise a crucible 55, as shown in FIG. 7. Solid Zn or In:Zn alloy 58 may be evaporated from the crucible 55 directly into the plasma 50.

Figure 8:
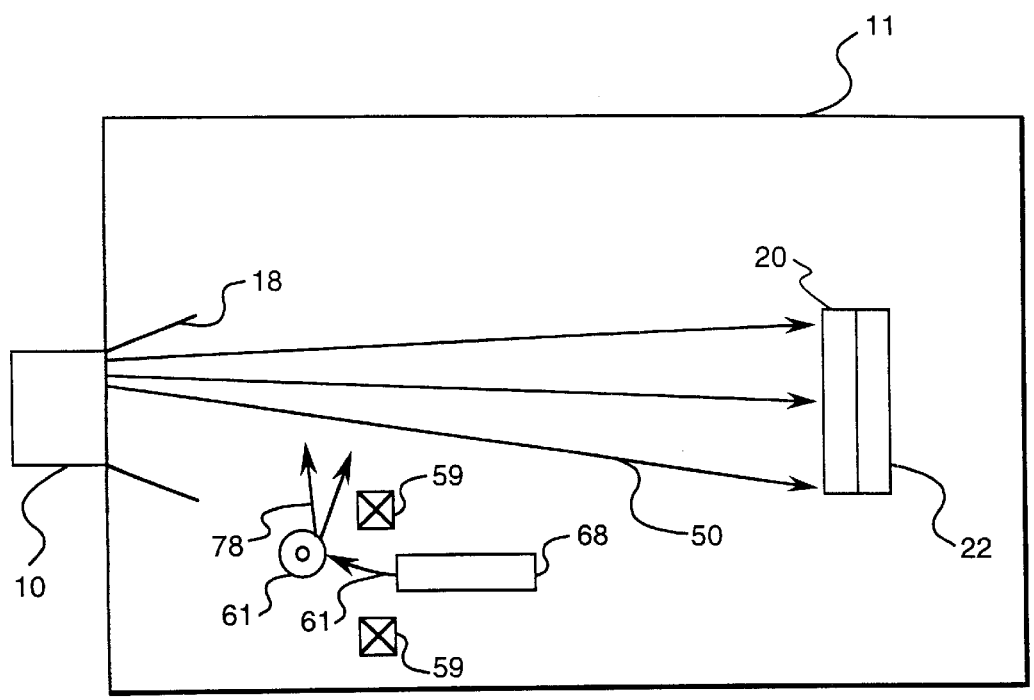
FIG. 8 shows a schematic view of the arc plasma deposition apparatus including an electron-beam evaporation system according to an alternative embodiment of the present invention.

In another embodiment, the reactant source comprises an electron-beam evaporation system, as shown in FIG. 8. An electron gun 68 emits a beam of electrons 60. The electron beam is directed toward a reactant target 61 by magnet(s) 59. As the electron beam 60 strikes the reactant target 61, it evaporates reactant atoms 78 from the reactant target. Preferably, the reactant target is a rotating wheel to allow uniform reactant release from the target 61. The reactant atoms 78 migrate toward the plasma 50 to be deposited on the substrate 20. The target 61 may comprise Zn, In:Zn, Al:Zn, ZnO, IZO, for example, or any combination thereof. If the target 61 contains oxygen, then a separate source of oxygen may be omitted. Likewise, the injection nozzle 18 may be omitted.

Furthermore, by covering the target 61 with a shutter, such as shutter 24 from FIG. 3, and applying a positive charge to the support 22, the Ar plasma may be used to bombard the substrate 20. This causes the plasma to sputter clean the substrate 20 prior to depositing the UV filter composition. This increases process throughput by eliminating a separate cleaning step in a separate chamber.

Figure 10:
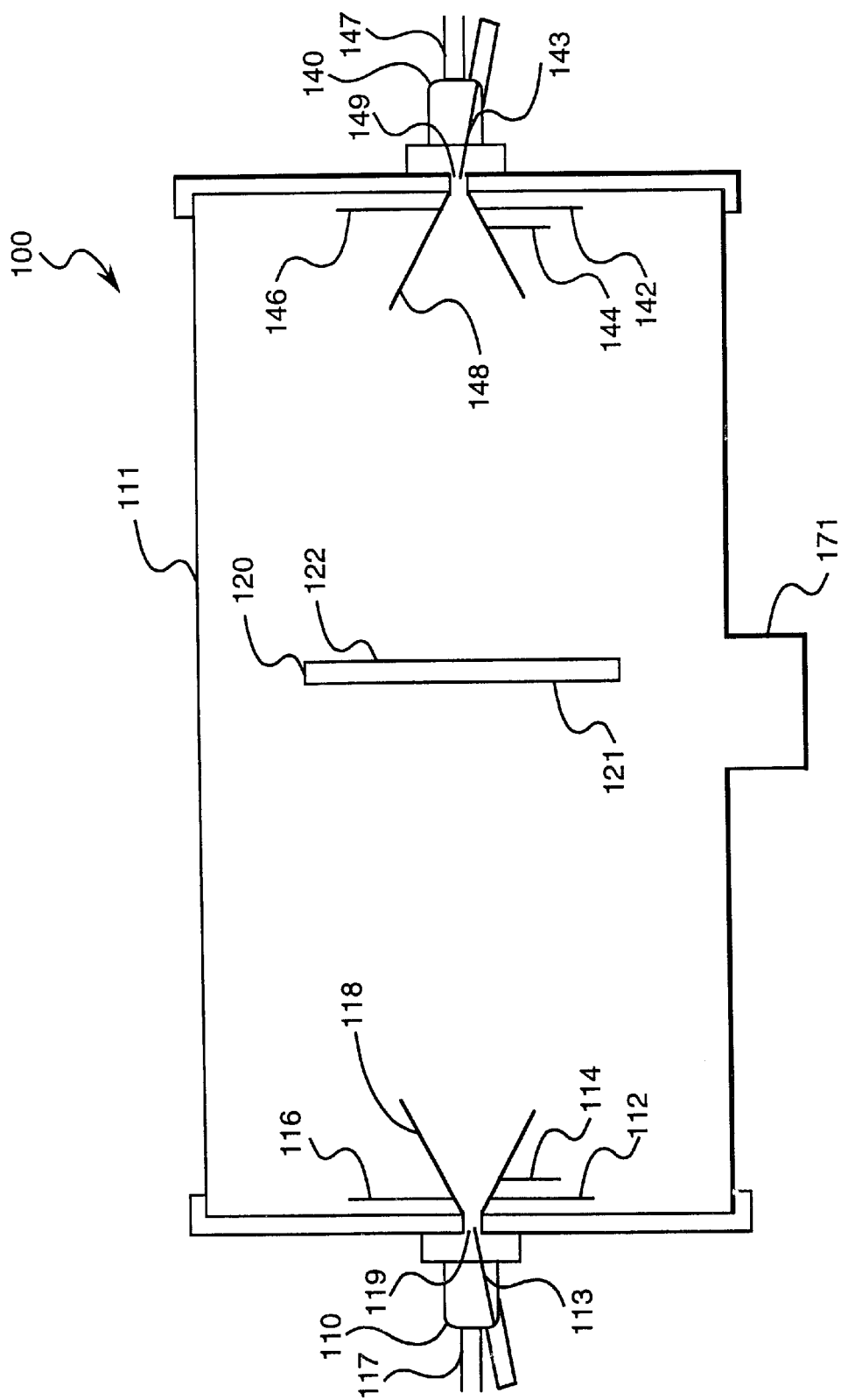
FIG. 10 shows a schematic view of an arc plasma deposition apparatus capable of simultaneously coating both sides of a substrate according to an alternative embodiment of the present invention.

In a further embodiment shown in FIG. 10, an arc plasma deposition apparatus 100 is configured with two plasma generation chambers 110 and 140 respectively. Unlike conventional PVD techniques, which rely on diffusion of a reactant vapor pool upwards towards a single surface of a substrate, the embodiment of FIG. 10 can simultaneously coat both surfaces of a substrate 120. The arc plasma deposition technique utilizes a plasma jet to transport the coating composition onto the substrate. The plasma generation chambers 110 and 140 respectively contain at least one cathode (113 and 143), a plasma gas supply line (117 and 147) and an anode (119 and 149). Chambers 110 and 140 are operated as discussed above. Chamber 111 contains a plurality of reactant supply lines. For example, chamber 111 may contain supply lines 112 and 142 (for oxygen) and supply lines 114 and 144 (for zinc) to deposit a ZnO film on surfaces 121 and 122 of substrate 120. Chamber 111 may also contain supply lines 116 and 146 to introduce another reactant, such as In, to the plasma stream in order to deposit IZO on the substrate. The supply lines preferably communicate with the injection nozzles 118 and 148 and supply reactants into the plasma flowing through the nozzle in a similar manner as described above. Chamber 111 also contains vacuum pumps (not shown) for evacuating the chamber, such as at port 171.

EXAMPLES

An arc plasma deposition apparatus, similar to that shown in FIGS. 2 and 3, was utilized to perform several experimental coating runs. The arc plasma generator included a copper anode separated from three needle-type cathodes of thoriated tungsten by at least one or a series of electrically isolated copper disks. Argon (Ar) was chosen as the plasma gas. With Ar flowing through the bore of the arc torch, a direct current (DC) voltage was applied to the electrodes to generate a plasma.

The plasma expanded through the injection nozzle, similar to the embodiment shown in FIG. 3, into the treatment chamber at a reduced pressure thus forming a plasma jet. The injection nozzle was thermally wrapped, so that the temperature was maintained at about 850 degrees centigrade, which is above the melting point temperature of the zinc and indium reactants. This increased temperature of the injection nozzle also helped to reduce the risk of clogging.

The substrate coated was a PC sheet. The substrates were cleaned in isopropyl alcohol and dried at 120 degrees in vacuum for at least 12 hours prior to deposition to degas the substrates. The substrate was supported on the plasma jet axis in the treatment chamber by a metal support stage. The support stage was located at a distance of about 25.5 cm from the anode. A retractable shutter was also utilized to regulate the exposure of the substrate to the plasma stream.

Each chamber was pumped to less than 1 milliTorr and back flushed with nitrogen to about 500 Torr then pumped back down at least two times to remove residual moisture from the chamber prior to introduction of the reactants. Oxygen was introduced into the plasma via a reactant supply line and reactant inlet, such as those shown above in FIG. 3. This setup produced an oxygen/argon plasma.

Coating runs 1–6 were conducted under a batch mode of operation. A zinc or a zinc-based alloy was thermally evaporated to produce a reactant vapor in an evaporator similar to that shown in FIG. 5A. The Zn-based reactant was then introduced into an injector of the nozzle into the plasma.

The nozzle used in the experimental coating runs contained a series of gas passages to feed reactants into the plasma. The nozzle was coupled to the evaporator with a ¼" stainless steel tube connected to one gas channel and set of injection holes. This steel tube had a cap on the end that fitted to a small nickel crucible with a Ta liner that was wrapped with a heating element to control it's temperature. Zinc and/or Zinc alloys such as In:Zn were placed into the crucible and press fitted against the feed tube. The nozzle was also wrapped to keep it above the melting point of zinc to prevent clogging of the injection holes. The Zn or In:Zn vapor reactant was introduced at a location down stream from the oxygen inlet site. The ZnO or IZO compound was formed in a so-called reaction zone of the plasma. For example, in FIG. 3, the reaction zone 38 occurs proximate to inlet 34.

Run 7 was conducted in a continuous mode, using an evaporator similar to that shown in FIG. 5B. In the continuous mode, -zinc wire having a 0.017"–0.05" diameter was fed into the evaporator by a wire feeder under motorized control through a stainless steel tube connected to the evaporator. Run 8 was made using an organometallic, rather than an evaporated reactant, in which the organometallic gas was introduced into the plasma by way of a reactant supply line.

A shutter was retracted and the substrate was exposed to the reactant compound (in this experiment ZnO or IZO) plasma to initiate deposition. The rate of ZnO and IZO deposition was controlled by maintaining the temperature of the metal, e.g., controlling the vapor pressure of the metal.

A range of experiments were conducted to optimize the current supplied to the arc (i.e., the arc current), the vapor pressure of the metal, and the flow rate of oxygen. Shown in TABLE 1 are some representative examples of ZnO and IZO depositions, as well as a comparison run of a DMZ reactant.

working distance (anode to substrate) of about 25.5 cm. Depositions were done on both Lexan and glass. Deposits on glass were used to measure the absorbency (A) at 350 nanometers (nm). Absorbency was measured on a UNICAM UV-3 UVNisible spectrophotometer. Haze measurements were made using a Gardner model XL-835 colorimeter.

As mentioned above the rate was generally controlled by the vapor pressure of the metal, (compare runs 1 and 2 and also 4, 5, 6) however, it was also affected by the current supplied to the arc. In these examples, if the arc current is too low, the adhesion and properties of the coating are affected. If the arc current is too high, (compare runs 2 and 3) the deposition rate drops off significantly, presumably due to formation of ZnO powder in the plasma which is carried off to the pumps. The arc current also affects the degree of ionization of the oxygen. Therefore, the arc current can be controlled to optimize coating quality.

The flow rate of oxygen affects the coating clarity or haze: if the flow rate is too low, the haze will be high. An exact calculation of the optimal ratio of O:Zn could not be done because the exact flow rate of Zn is not known. However, an estimate based on the deposition rate and anticipated utilization of the zinc is about 5:1.

The absorbency of these coatings from the vaporized reactants were excellent compared to ZnO and IZO deposited from organometallics such as DMZ. A typical DMZ example is shown in run 8. The absorbency was lower for equivalent thickness and the haze was higher. An important difference is that the DMZ requires much higher arc power in order to break down the organometallic and hence results in a higher thermal load on the substrate. In addition, increasing the argon flow (see run 7) resulted in low haze at lower oxygen flow rates.

It was also observed that using the In:Zn alloy as the evaporated reactant resulted in coatings that were predomi-

TABLE 1

| run | Evap | Zn T (° C.) | I | Press (mT) | Ar lpm | $O_2$ lpm | Time (sec) | thick ($\mu$m) | A | T (%) | H (%) |
|---|---|---|---|---|---|---|---|---|---|---|---|
| 1 | Zn | 705 | 50 | 79 | .75 | 5 | 120 | .18 | 1.94 | 90 | 0.5 |
| 2 | In:Zn | 825 | 50 | 80 | .75 | 7 | 20 | .63 | 1.22 | 86 | 1.0 |
| 3 | In:Zn | 820 | 37 | 50 | .75 | 4 | 20 | 1.41 | 4.39 | 74 | 22 |
| 4 | In:Zn | 820 | 37 | 80 | .75 | 7 | 20 | 1.44 | 4.55 | 89 | 3.5 |
| 5 | In:Zn | 810 | 28 | 100 | .75 | 9 | 20 | .91 | 3.90 | 89 | 2.6 |
| 6 | In:Zn | 800 | 29 | 114 | 1.25 | 10 | 10 | .38 | 2.70 | 88 | 1.0 |
| 7 | Zn | 810 | 30 | 38 | 1.5 | 2 | 10 | .48 | 3.8 | 89 | 0.5 |
| 8 | DMZ | 25 | 60 | 100 | 1.5 | 8 | 10 | .55 | 2.0 | 90 | 2.6 |

As shown in Table 1, "Evap" refers to the material that was evaporated or fed to the nozzle; "Zn T" refers to the temperature of the material being evaporated (the vapor pressure of the Zn and hence the rate in which the Zn is introduced into the plasma is proportional to this temperature) in degrees Celsius; "I" refers to the anode-cathode (i.e., arc) current (in amperes), which in all cases was split evenly among the 3 cathodes; "Press" refers to the deposition chamber pressure in milliTorr; Ar refers to the argon flow rate in standard liters per minute (lpm); $O_2$ refers the oxygen flow rate in lpm;; "A" refers to absorbency at 350 nm; T" is the transmission of light in units of percent (%); and "H" refers to the measured haze (percentage of light scattering).

The primary difference in depositing the Zn and In:Zn materials was that Zn was melted for ZnO, and an alloy of 2.5% In:Zn was melted for IZO. All runs were done with a nately Zn. This was due to the lower vapor pressure of Indium. However, a coating having a higher In concentration can be achieved by optimizing the temperature of the In:Zn evaporator or by injecting indium into the plasma through a separate injector, and/or by using a second evaporator for indium.

As seen from the results of the previous examples, the arc plasma deposition technique of the present invention has many advantages over PVD or conventional arc plasma deposition processes. First, very high rates are achievable without thermally damaging the PC substrate. As shown in the examples discussed above, demonstrated deposition rates can be as high as 4 $\mu$m/minute, while still maintaining an acceptable coating quality. Based on these results, even higher deposition rates can be achieved with optimization. Second, a very inexpensive, readily available and easily interchangeable source material can be used. In the example, the source material can comprise zinc or a zinc alloy. Third, the coating can be electrically conductive which is useful for applications such as flat panel displays. Fourth, both sides of a substrate can be coated simultaneously by projecting the reactants with two plasma jets, saving considerable time and eliminating the steps and equipment necessary to flip the substrate, mask the back side of the substrate, and recoat the substrate.

Further, less arc current is required to perform the reaction to form the deposition compound, especially as compared to reacting an organometallic gas such as DMZ or DEZ. For example, when using DMZ or DEZ, part of the energy of the plasma is imparted to break down the organometallic. In contrast, by injecting zinc vapor (or the like) into the plasma, it is observed that less energy is needed to form zinc oxide. The technique of the present invention results in less thermal load to the substrate. Finally, excellent coating properties can be achieved such as higher UV absorbency than other conventional methods, excellent transmission in the visible, and low haze. The water soak stability of the coating is also improved, as described in the above-referenced U.S. Pat. No. 6,261,694.

The present invention is particularly useful as part of an automotive glazing package. It is also useful for a variety of applications of PC needing extended weathering capability such as architectural windows, headlamps, airplane canopies, etc. Further, it is also useful for solar cells. In addition, the coated substrates can be utilized in various apparatus display windows such as TV screens, LCD screens, flat panel displays, plasma display screens, and computer terminal screens and glare guards.

While the invention has been described in detail and with reference to specific embodiments thereof, it will be apparent to one skilled in the art that various changes and modifications can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method of coating a substrate, the method comprising the steps of:

generating a plasma by ionizing a carrier gas with an arc extending between an anode and a cathode, wherein the cathode is substantially non-consumable, and wherein the plasma is directed toward the substrate as a result of a pressure difference between a first chamber in which the plasma is generated and a second chamber in which the substrate is located;

evaporating a metallic reactant from a source which is separate from the cathode and anode; and introducing the evaporated metallic reactant into the flowing plasma such that the plasma projects the metallic reactant onto the substrate.

2. The method of claim 1, wherein the metallic reactant comprises an elemental metal.

3. The method of claim 1, Wherein the metallic reactant comprises an alloy.

4. The method of claim 1, further comprising the step of introducing an oxidant into the flowing plasma to react with the evaporated metallic reactant.

5. The method of claim 1, wherein the metallic reactant is selected from the group consisting of elemental zinc, elemental indium, elemental aluminum, an indium zinc alloy, and an aluminum zinc alloy.

6. The method of claim 1, further comprising the step of controlling a rate of deposition of the metallic reactant.

7. The method of claim 6, wherein the rate of deposition is controlled by controlling a vapor pressure of the metallic reactant.

8. The method of claim 6, wherein the rate of deposition is controlled by controlling a current supplied to the arc.

9. The method of claim 1, further comprising the step of introducing a second reactant from a second source into the flowing plasma along with the metallic reactant.

10. The method of claim 9, further comprising:

reacting the metallic reactant and the second reactant in the flowing plasma to form a compound comprising the metallic reactant and the second reactant; and depositing the compound on the substrate.

11. The method of claim 10, wherein the first reactant comprises zinc, the second reactant comprises oxygen, and the compound formed is zinc oxide.

12. The method of claim 9, further comprising the step of introducing a third reactant from a third source into the flowing plasma along with the metallic reactant and the second reactant.

13. The method of claim 12, further comprising:

reacting the metallic reactant, the second reactant, and the third reactant in the plasma to form a compound comprising the metallic reactant, the second reactant, and the third reactant; and depositing the compound on the substrate.

14. The method of claim 13, wherein the first reactant comprises zinc, the second reactant comprises oxygen, and the third reactant comprises a dopant, and the compound comprises doped zinc oxide, and wherein the compound is deposited on the substrate.

15. The method of claim 13, wherein the first reactant comprises zinc, the second reactant comprises oxygen, and the third reactant comprises indium, and the compound comprises indium zinc oxide, and wherein the compound is deposited on the substrate.

16. The method of claim 13, wherein the first reactant comprises zinc, the second reactant comprises oxygen, and the third reactant comprises aluminum, and the compound comprises aluminum zinc oxide, and wherein the compound is deposited on the substrate.

17. The method of claim 1, wherein the step of introducing the evaporated metallic reactant into the flowing plasma comprises directing the evaporated metallic reactant into a nozzle which extends from the anode.

18. The method of claim 17, wherein the step of directing the evaporated metallic reactant into the nozzle comprises providing a conduit in fluid communication with at least one opening into the nozzle.

19. The method of claim 18, further comprising the step of introducing a second reactant into the flowing plasma through a second conduit in fluid communication with a second opening into the nozzle.

20. The method of claim 18, further comprising:

coupling an evaporator to the conduit.

21. The method of claim 1, further comprising:

placing the substrate in a second chamber;

introducing a plasma into a first chamber in fluid communication with the second chamber;

generating the arc in the first chamber between the anode and the cathode to generate the plasma; and reducing a second pressure in the second chamber below a first pressure in the first chamber to cause the plasma to flow into the second chamber toward the substrate.

22. The method of claim 21, further comprising the steps of:

providing an aperture in the anode; and providing a nozzle which extends from the anode.

23. The method of claim 22, further comprising the step of controlling, with the nozzle, a density of the plasma as a function of distance to the substrate.

24. The method of claim 21, wherein the metallic reactant comprises zinc, and the method further comprises the steps of:

evaporating a second metallic reactant into the plasma;

flowing an oxidant into the plasma;

reacting the zinc, the second metallic reactant, and the oxidant in the plasma to form a compound; and depositing the compound on the substrate.

25. The method of claim 24, wherein the second metallic reactant comprises indium.

26. The method of claim 1, wherein the step of evaporating the metallic reactant comprises:

continuously supplying a metallic reactant wire into an evaporator; and vaporating a portion of the wire in the evaporator.

27. The method of claim 1, wherein the step of introducing the evaporated metallic reactant into the flowing plasma comprises directing the metallic reactant into a nozzle which diverges in a flow direction toward the substrate.

28. The method of claim 1, wherein the step of introducing the evaporated metallic reactant into the flowing plasma comprises directing the metallic reactant into a nozzle having a conical inner surface which diverges in a flow direction toward the substrate.

29. The method of claim 1, wherein the step of introducing the evaporated metallic reactant into the flowing plasma comprises directing the evaporated metallic reactant through a conduit having a circular path and a plurality of holes which open into an inner surface of a diverging nozzle.

30. The method of claim 1, further comprising the step of controlling a power applied to: a) the anode and the cathode and b) the source of the metallic reactant, wherein the power applied to the anode and cathode and the power applied to the source of the metallic reactant are controlled independently of each other.

31. The method of claim 1, wherein the anode includes an aperture through which the plasma flows, and the pressure difference between the first chamber and the second chamber and a size of the aperture together produce a plasma jet which flows into the second chamber.

32. A method of coating a first surface and a second surface of a substrate, comprising:

generating a first plasma by ionizing a first carrier gas with a fist arc extending between a first anode and a first cathode, wherein the first cathode is substantially non-consumable, and wherein the first plasma is directed toward the first surface of the substrate as a result of a pressure difference between a first chamber in which the first plasma is generated and a second chamber in which the substrate is located;

generating a second plasma by ionizing a second carrier gas with a second arc extending between a second anode and a second cathode, wherein the second cathode is substantially non-consumable, and wherein the second plasma is directed toward the second surface of the substrate;

evaporating a metallic reactant from a source which is separate from the first cathode and first anode;

introducing the evaporated tic reactant into the first plasma such that the fist plasma projects the metallic reactant onto the first surface of the substrate; and introducing a second reactant into the second plasma to project the second reactant onto the second surface of the substrate.

33. The method of claim 32, wherein the first plasma is generated by the first arc extending between the first anode and the first cathode, and the step of introducing the evaporated metallic reactant into the first plasma comprises directing the evaporated metallic reactant through a divergent nozzle toward the substrate.

34. The method of claim 32, wherein the step of introducing the evaporated metallic reactant into the first plasma comprises directing the evaporated metallic reactant through a conduit having a circular path and a plurality of holes which open to an inner surface of a diverging nozzle.

35. The method of claim 33, wherein the metallic reactant comprises zinc, and the method further comprises the step of introducing an oxidant into the plasma with the zinc.

36. The method of claim 35, further comprising the step of introducing at least one of indium and aluminum into the first plasma with the zinc and the oxidant.

37. A method of coating a substrate, the method comprising the steps of:

generating a plasma by ionizing a carrier gas with an arc extending between an anode and a cathode, wherein the cathode is substantially non-consumable, and wherein the plasma flows toward the substrate;

evaporating a metallic reactant; and introducing the evaporated metallic reactant into the flowing plasma by directing the evaporated metallic reactant into a nozzle which diverges in a flow direction toward the substrate to project the metallic reactant onto the substrate.

38. The method of claim 37, wherein the nozzle has a conical inner surface.

39. The method of claim 37, wherein the step of introducing the evaporated metallic reactant into the flowing plasma comprises directing the evaporated metallic reactant through a circular conduit having a plurality of holes which open into an inner surface of the nozzle.

40. The method of claim 37, further comprising the step of controlling a power applied to: a) the anode and the cathode and b) the source of the metallic reactant, wherein the power applied to the anode and cathode and the power applied to the source of the metallic reactant are controlled independently of each other.

41. The method of claim 37, wherein the metallic reactant comprises zinc, and the method further comprises the steps of:

introducing an oxidant into the plasma with the zinc; and introducing at least one of indium and aluminum into the plasma with the zinc and the oxidant.

* * * * *